(12) United States Patent
Liu et al.

(10) Patent No.: US 11,398,807 B2
(45) Date of Patent: Jul. 26, 2022

(54) SIGNAL TRANSMISSION DEVICE AND CABLE CONNECTING CIRCUIT

(71) Applicants: Shih-Ping Liu, Taipei (TW); Chia-Yuan Lin, Taipei (TW); Kuang-Ta Sun, Taipei (TW); Bo-Ru Zeng, Taipei (TW); Tzu-Tu Hsu, Taipei (TW); Kai-Lun Huang, Taipei (TW)

(72) Inventors: Shih-Ping Liu, Taipei (TW); Chia-Yuan Lin, Taipei (TW); Kuang-Ta Sun, Taipei (TW); Bo-Ru Zeng, Taipei (TW); Tzu-Tu Hsu, Taipei (TW); Kai-Lun Huang, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 4 days.

(21) Appl. No.: 17/159,185

(22) Filed: Jan. 27, 2021

(65) Prior Publication Data
US 2021/0242854 A1 Aug. 5, 2021

Related U.S. Application Data

(60) Provisional application No. 62/969,164, filed on Feb. 3, 2020.

(51) Int. Cl.
*H03H 7/48* (2006.01)
*H04L 25/02* (2006.01)
(Continued)

(52) U.S. Cl.
CPC .............. *H03H 7/482* (2013.01); *H01P 3/06* (2013.01); *H01R 13/646* (2013.01); *H03H 7/0115* (2013.01); *H04L 25/026* (2013.01)

(58) Field of Classification Search
CPC ........ H03H 7/482; H03H 7/0115; H01P 3/08; H01R 13/646; H04L 25/026
See application file for complete search history.

(56) References Cited

U.S. PATENT DOCUMENTS

| 9,893,710 B2 * | 2/2018 | Leipold ..................... H03F 3/68 |
| 2007/0063771 A1 * | 3/2007 | Pan ........................ H01P 1/2007 330/149 |
| 2012/0307695 A1 | 12/2012 | Yehezkely et al. |

FOREIGN PATENT DOCUMENTS

| CN | 201590470 | 9/2010 | |
| CN | 109565296 A * | 4/2019 | ............... H03H 1/02 |

* cited by examiner

*Primary Examiner* — Stephen E. Jones
*Assistant Examiner* — Kimberly E Glenn
(74) *Attorney, Agent, or Firm* — JCIPRNET

(57) ABSTRACT

A signal transmission device, including a RF processing circuit and a cable connecting circuit including a first choke inductor, a first and second bypass capacitors, and a first coupling capacitor, is provided. One end of the first choke inductor is coupled to a transceiver end of a RF transceiver and the other end is coupled to a first control end of a RF antenna controller. The transceiver end is coupled to a first conductor. The first bypass capacitor is coupled between the other end and a digital ground terminal. The first coupling capacitor is coupled between the digital ground terminal and a RF ground terminal. The second conductor is coupled to the RF ground terminal and a second control terminal of the RF antenna controller at a second connecting end of a RF cable. The second bypass capacitor is coupled between the second control terminal and the digital ground terminal.

11 Claims, 4 Drawing Sheets

(51) Int. Cl.
*H01R 13/646* (2011.01)
*H03H 7/01* (2006.01)
*H01P 3/06* (2006.01)

SIGNAL TRANSMISSION DEVICE AND CABLE CONNECTING CIRCUIT

CROSS-REFERENCE TO RELATED APPLICATION

This application claims the priority benefit of U.S. provisional application Ser. No. 62/969,164, filed on Feb. 3, 2020. The entirety of the above-mentioned patent application is hereby incorporated by reference herein and made a part of this specification.

BACKGROUND

Technical Field

The invention relates to a signal transmission technology of a radio frequency antenna, and particularly relates to a signal transmission device and a cable connecting circuit for transceiving control information to/from an active antenna through a radio frequency cable.

Description of Related Art

Today's electronic devices usually have wireless communication functions and are equipped with antennas. In order to achieve multi-frequency, ultra-wideband, or meet a design of human body radiation reception specifications within a limited space, the antenna is further integrated with other circuits to become an active antenna, so as to achieve multi-band, high efficiency and other high-performance or multi-functional specifications.

On the other hand, an electronic device usually uses a coaxial cable as a radio frequency (RF) cable to send and receive RF signals to/from an active antenna. If the electronic device wants to send and receive corresponding control signals to/from the active antenna, it needs to additionally install a wire or cable to implement control of the active antenna. Therefore, if the electronic device needs to control the active antenna or sense an external environment through the active antenna, the cost of a connecting wire and a connector used to transmit control signals is inevitably increased, but it also occupies a part of space of a printed circuit board in the electronic device to serve as a signal transmission terminal.

SUMMARY

The invention is directed to a signal transmission device, which transmits control signals to an active antenna module through a radio frequency cable, or transmits a signal from the active antenna module to a radio frequency antenna controller, and adjusts a cable connecting circuit at both ends of the radio frequency cable without adjusting a structure of the radio frequency cable, so as to save the related cost of wires used for transmitting control signals and avoid occupying a part of space of a printed circuit board in the electronic device for serving as a signal transmission terminal.

An embodiment of the invention provides a signal transmission device including a radio frequency (RF) processing circuit and a cable connecting circuit. The RF processing circuit is coupled to a first connecting end of a RF cable. The RF processing circuit has a first transceiver end and a second transceiver end. The first transceiver end is coupled to a first conductor in the RF cable and the second transceiver end is coupled to a second conductor in the RF cable. The cable connecting circuit is coupled to a second connecting end of the RF cable, a RF transceiver and a RF antenna controller. The cable connecting circuit includes a first choke inductor, a first bypass capacitor, a first coupling capacitor, and a second bypass capacitor. One end of the first choke inductor is coupled to a transceiver end of the RF transceiver, the other end of the first choke inductor is coupled to a first control end of the RF antenna controller, and the transceiver end is coupled to the first conductor. The first bypass capacitor is coupled between the other end of the first choke inductor and a digital ground terminal. The first coupling capacitor is coupled between the digital ground terminal and a RF ground terminal. The second conductor is coupled to the RF ground terminal and a second control end of the RF antenna controller at the second connecting end of the RF cable. The second bypass capacitor is coupled between the second control end of the RF antenna controller and the digital ground terminal.

An embodiment of the invention provides a cable connecting circuit adapted to an electronic device including a connecting end of a RF cable, a RF transceiver, and a RF antenna controller. The cable connecting circuit includes a first choke inductor, a first bypass capacitor, a first coupling capacitor, and a second bypass capacitor. One end of the first choke inductor is coupled to a transceiver end of the RF transceiver, the other end of the first choke inductor is coupled to a first control end of the RF antenna controller, and the transceiver end is coupled to a first conductor of the RF cable. The first bypass capacitor is coupled between the other end of the first choke inductor and a digital ground terminal. The first coupling capacitor is coupled between the digital ground terminal and a RF ground terminal. A second conductor of the RF cable is coupled to the RF ground terminal and a second control end of the RF antenna controller at the connecting end of the RF cable. The second bypass capacitor is coupled between the second control end of the RF antenna controller and the digital ground terminal.

Based on the above description, in the signal transmission device and the cable connecting circuit described in the embodiments, through two conductors in the RF cable that are not contacted with each other (i.e., an inter wire and an outer mesh conductor in the RF cable), and based on the effects that the capacitors have low impedance in a high frequency signal domain to generate a virtual short circuit, and the inductor has high impedance in the high frequency signal domain to generate a virtual open circuit, high frequency signals of the RF transceiver in the electronic device may be received and transmitted through the antenna, and the RF antenna controller and the active antenna module may exchange control signals through the RF cable. In this way, by adjusting the cable connecting circuit and/or the RF processing circuit at both ends of the RF cable without adjusting the structure of the RF cable, the control signal of the active antenna module or the sensing signal obtained by the active antenna may be transmitted through the RF cable, and there is no need to add additional connecting wires, connectors, and terminals on the printed circuit board for transmitting the control signal or the sensing signal, thereby saving the related cost of wires for transmitting the control signal and the sensing signal and avoiding occupying a part of space of the printed circuit board in the electronic device for serving as a signal transmission terminal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
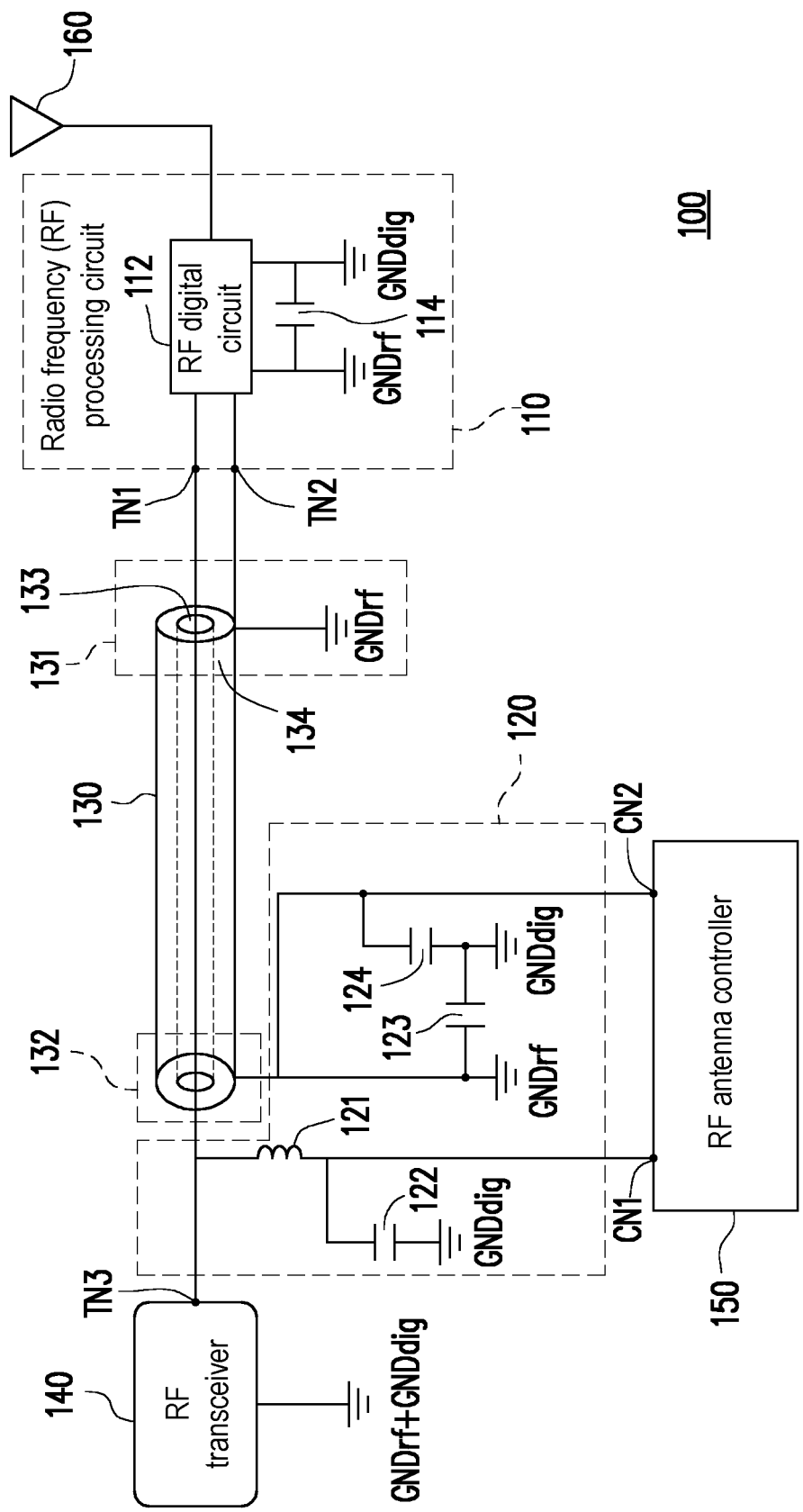
FIG. 1 is a schematic diagram of a signal transmission device according to a first embodiment of the invention.

FIG. 1 is a schematic diagram of a signal transmission device 100 according to a first embodiment of the invention. The signal transmission device 100 is suitable for an electronic device equipped with an antenna 160, and the electronic device uses a radio frequency (RF) cable 130 to transmit RF signals transceived by the antenna 160.

The antenna 160 of the embodiment may be a passive antenna, or the antenna 160 and a RF processing circuit 110 may be integrated with each other to serve as an active antenna, such as a tunable antenna or a hybrid antenna, and those applying this embodiment may use different types of antennas according to their needs, for example, an electronic scanning antenna array with a tunable directional antenna and capable of changing a beam scanning direction, an antenna adapted to adjust a frequency response or a filter strength through control signals, etc.

The signal transmission device 100 mainly includes the RF processing circuit 110 and a cable connecting circuit 120. In the embodiment, the RF processing circuit 110 and the cable connecting circuit 120 in the electronic device are connected by the RF cable 130. The RF processing circuit 110 is coupled to a first connecting end 131 of the RF cable 130. The RF processing circuit 110 is further coupled to the antenna 160. The cable connecting circuit 120 is coupled to a second connecting end 132 of the RF cable 130, a RF transceiver 140 and a RF antenna controller 150. Namely, the first connecting end 131 of the RF cable 130 is used to connect the RF processing circuit 110, and the second connecting end 132 of the RF cable 130 is used to connect to the cable connecting circuit 120. The RF processing circuit 110 has a first transceiver end TN1 and a second transceiver end TN2. The first transceiver end TN1 is coupled to a first conductor 133 in the RF cable 130, and the second transceiver end TN2 is coupled to a second conductor 134 in the RF cable 130.

The RF cable 130 of the embodiment is implemented by a coaxial cable. The coaxial cable has an innermost inner wire (corresponding to the first conductor 133 of the embodiment), an insulator (usually made of a plastic material) laid on the inner wire, a mesh conductor located on an outer layer of the insulator (corresponding to the second conductor 134 of the embodiment), and an outermost insulating material. The inter wire is usually a copper wire.

The cable connecting circuit 120, the RF transceiver 140, and the RF antenna controller 150 of the embodiment may be disposed on a same printed circuit board, and the cable connecting circuit 120 is used as a connecting port for connecting the second connecting end 132 of the RF cable 130. The RF transceiver 140 is used to receive RF signals coming from or transmitted to the antenna 160 through the RF cable 130. The RF antenna controller 150 is used to generate control signals at a first control end CN1 and a second control end CN2 thereof, so as to control the RF processing circuit 110 of the active antenna through the RF cable 130. On the other hand, the radio frequency antenna controller 150 may also receive a sensing signal from the RF processing circuit 110 in the active antenna through the RF cable 130 by using the first control end CN1 or the second control end CN2. The RF antenna controller 150 may be controlled by a motherboard controller or other processors in the electronic device.

The cable connecting circuit 120 is mainly coupled to the second connecting end 132 of the RF cable 130, the RF transceiver 140 and the RF antenna controller 150. The cable connecting circuit 120 includes a first choke inductor 121, a first bypass capacitor 122, a first coupling capacitor 123 and a second bypass capacitor 124. One end of the first choke inductor 121 is coupled to a transceiver end TN3 of the RF transceiver 140. The other end of the first choke inductor 121 is coupled to the first control end CN1 of the RF antenna controller. The transceiver end TN3 of the RF transceiver 140 is coupled to the first conductor 133 of the RF cable 130 (i.e. the inner wire of the RF cable 130). The first bypass capacitor 122 is coupled between the other end of the first choke inductor 121 and a digital ground terminal GNDdig.

The first coupling capacitor 123 is coupled between the digital ground terminal GNDdig and a RF ground terminal GNDrf. The second conductor 134 of the RF cable 130 (i.e. the mesh conductor of the RF cable 130) is coupled to the RF ground terminal GNDrf and the second control end CN2 of the RF antenna controller 150 at the second connecting end 132 of the RF cable 130. The second bypass capacitor 124 is coupled between the second control end CN2 of the RF antenna controller 150 and the digital ground terminal GNDdig.

The digital ground terminal GNDdig in the embodiment is used as an internal system ground terminal in the electronic device, and the RF ground terminal GNDrf is used as a RF ground terminal of the RF cable 130 and the active antenna in the electronic device. The two ground terminals have different voltage levels due to that they are not directly connected, so that these two different ground terminals are specifically indicated in the embodiment, and are coupled with each other by the properly designed first coupling capacitor 123, so as to achieve a same high frequency voltage level.

In this way, in the signal transmission device 100 and the cable connecting circuit 120 of the embodiment of the invention, through two conductors 133 and 134 in the RF cable 130 that are not contacted with each other (i.e., an inter wire and the outer mesh conductor in the RF cable 130) and due to that the capacitors (for example, the first bypass capacitor 122, the first coupling capacitor 123 and the second bypass capacitor 124) generate a virtual short circuit effect in a high frequency signal domain and the inductor (for example, the first choke inductor 121) generates a virtual open circuit effect in the high frequency signal domain, high frequency signals required to be transmitted or received by the RF transceiver 140 may be transceived by the active antenna including the antenna 160 and the RF processing circuit 110, and the control signals provided by the RF antenna controller 150 or the sensing signal to be received may be exchanged with the RF processing circuit 110 in the active antenna through the RF cable 130. In this way, by adjusting the cable connecting circuit 120 connected to the second connecting end 132 of the RF cable 130 and the RF processing circuit 110 connected to the first connecting end 131 without adjusting a structure of the RF cable 130, the control signal of the active antenna or the sensing signal obtained by the active antenna may be transmitted through the RF cable 130, and there is no need to add additional connecting wires, connectors, and terminals on the printed circuit board for transmitting the control signal or the sensing signal, thereby saving the related cost of wires for transmitting the control signal and the sensing signal and avoiding occupying a part of space of the printed circuit board in the electronic device for serving as a signal transmission terminal.

In addition to a RF digital circuit 112 used for controlling the active antenna, the RF processing circuit 110 further includes a second coupling capacitor 114. The second coupling capacitor 114 is coupled between the RF ground terminal GNDrf and the digital ground terminal GNDdig.

The RF processing circuit 110 is further coupled to the antenna 160. The RF processing circuit 110 uses the first transceiver end TN1 and the second transceiver end TN2 to obtain control signals from the first control end CN1 and the second control end CN2 of the RF antenna controller 150 through the RF cable 130, and controls the antenna 160 according to the control signals; or provides the sensing signal to the RF antenna controller 150 through the RF cable 130, the first control end CN1 or the second control end CN2. In detail, the control signal provided by the RF antenna controller 150 or the received sensing signal is a DC signal (or a low frequency signal), and the first control end CN1 of the RF antenna controller 150 is coupled to first conductor 133 of the RF cable 130 through the first choke inductor 121, and the second control end CN2 of the RF antenna controller 150 is directly coupled to the second conductor 134 of the RF cable 130.

The RF signal received or transmitted by the antenna 160 is a high frequency alternating current (AC) signal. Therefore, the RF signal obtained or to be transmitted by the antenna 160 may be transmitted to or obtained from the transceiver end TN3 of the RF transceiver 140 through the first transceiver end TN1 of the RF processing circuit 110 and the RF cable 130.

In this way, in the high frequency signal domain (i.e., in the case of high frequency signal transmission), two ends of the first bypass capacitor 122, the first coupling capacitor 123, the second bypass capacitor 124, and the second coupling capacitor 114 in FIG. 1 may produce a virtual short circuit effect, so that voltage levels of the RF ground terminal GNDrf and the digital ground terminal GNDdig are the same, and the second conductor 134 of the RF cable 130 is connected to the RF ground terminal GNDrf and the digital ground terminal GNDdig. On the other hand, in the high frequency signal domain (i.e., in the case of high frequency signal transmission), two ends of the first choke inductor 121 in FIG. 1 may produce a virtual open circuit effect, so that the first conductor 133 of the RF cable 130 in FIG. 1 is not coupled to the first control end CN1 of the RF antenna controller 150, and the RF signal received by the antenna 160 or the RF signal to be transmitted by the antenna 160 may be smoothly transmitted to or received from the transceiver end TN3 of the RF transceiver 140 through the first conductor 133 of the RF cable 130. Namely, in the high frequency signal domain, viewing from the transceiver end TN3 of the RF transceiver 140 toward the first choke inductor 121, the circuit has a high impedance state.

In the low frequency signal domain (i.e., in the case of low frequency signal transmission), two ends of the first bypass capacitor 122, the first coupling capacitor 123, the second bypass capacitor 124, and the second coupling capacitor 114 in FIG. 1 may produce a virtual open circuit effect, so that the first control end CN1 and the second control end CN2 of the RF antenna controller 150 are not coupled to the RF ground terminal GNDrf and the digital ground terminal GNDdig. Direct current (DC) voltage levels of the RF ground terminal GNDrf and the digital ground terminal GNDdig may be different due to the open circuit of the first coupling capacitor 123 and the second coupling capacitor 114. In addition, in the low frequency signal domain (i.e., in the case of low frequency signal transmission), two ends of the first choke inductor 121 in FIG. 1 may produce a virtual short circuit effect, so that DC control signals generated by the first control end CN1 and the second control end CN2 of the RF antenna controller 150 may be transmitted to the first transceiver end TN1 and the second transceiver end TN2 of the RF processing circuit 110 through the first conductor 133 and the second conductor 134 of the RF cable 130. Conversely, the DC sensing signal generated by the first transceiver end TN1 or the second transceiver end TN2 of the RF processing circuit 110 may also be transmitted to the first control end CN1 or the second control end CN2 of the RF antenna controller 150 through the first conductor 133 or the second conductor 134 of the RF cable 130.

Figure 2:
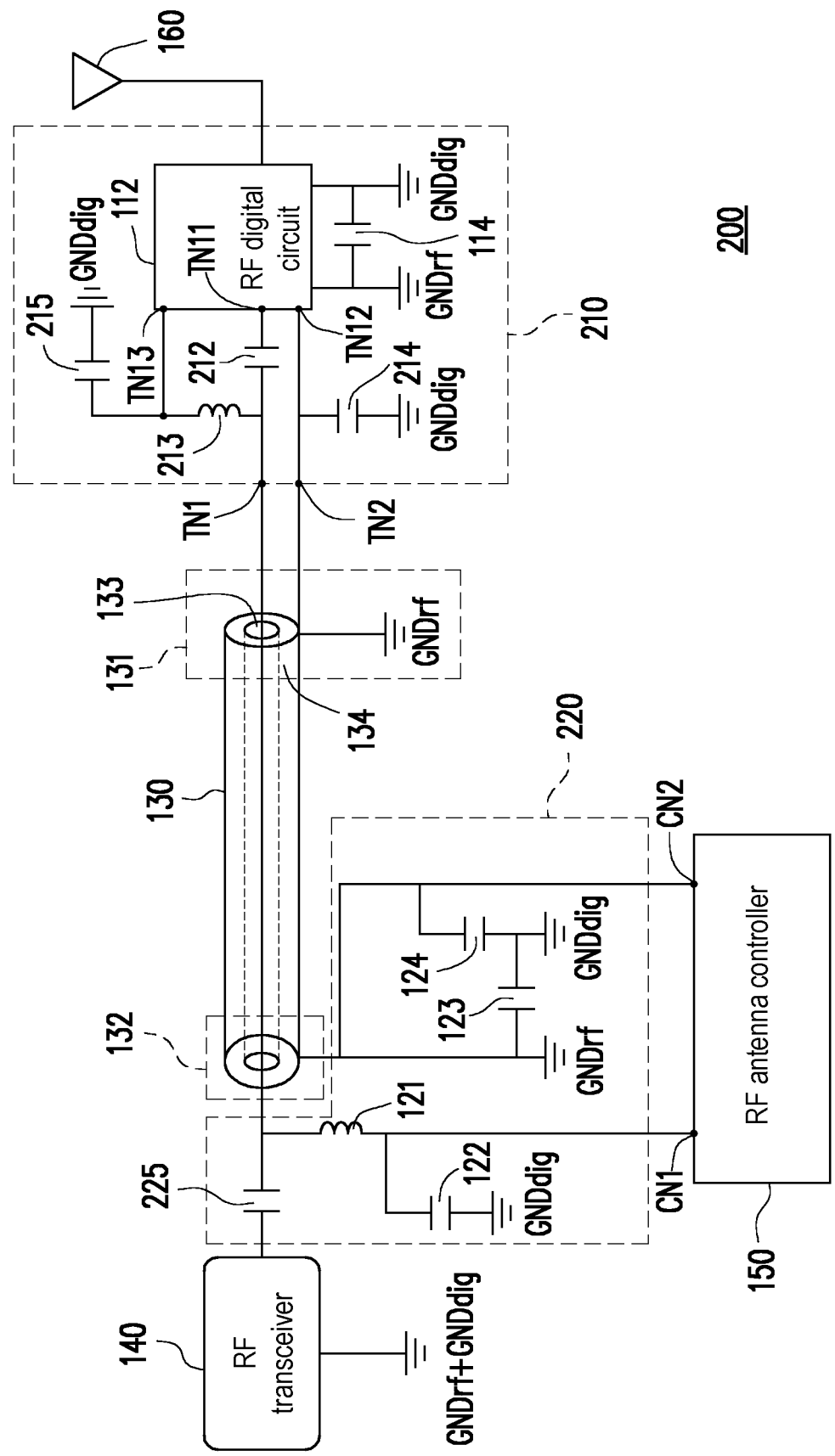
FIG. 2 is a detailed schematic diagram of a signal transmission device according to a second embodiment of the invention.

FIG. 2 is a detailed schematic diagram of a signal transmission device 200 according to a second embodiment of the invention. A main difference between FIG. 1 and FIG. 2 is that the RF processing circuit 210 and the cable connecting circuit 220 of the signal transmission device 200 in FIG. 2 disclose more circuit structures conformed to the embodiments of the invention.

In addition to the RF digital circuit 112 and the second coupling capacitor 114, the RF processing circuit 210 in FIG. 2 further includes a DC blocking capacitor 212, a second choke inductor 213, a third bypass capacitor 214, and a fourth bypass capacitor 215. The RF digital circuit 112 includes a RF output end TN11, a first control signal receiving end TN13, and a second control signal receiving end TN12. The RF output end TN11 of the RF digital circuit 112 is used to transmit a RF signal obtained or to be transmitted by the active antenna 160. The first control signal receiving end TN13 and the second control signal receiving end TN12 of the RF digital circuit 112 are used to receive the control signals transmitted by the RF antenna controller 150. In addition, the first control signal receiving end TN13 or the second control signal receiving end TN12 is also used to transmit the sensing signal received by the RF antenna controller 150. The second control signal receiving end TN12 of the RF digital circuit 112 is directly coupled to the second transceiver end TN2 of the RF processing circuit 210.

The DC blocking capacitor 212 is coupled between the first transceiver end TN1 of the RF processing circuit 210 and the RF output end TN11 of the RF digital circuit 112. The second choke inductor 213 is coupled between the first transceiver end TN1 of the RF processing circuit 210 and the first control signal receiving end TN13 of the RF processing circuit 210. The third bypass capacitor 214 is coupled between the second transceiver end TN2 of the RF processing circuit 210 and the digital ground terminal GNDdig. The fourth bypass capacitor 215 is coupled between the first control signal receiving end TN13 of the RF processing circuit 210 and the digital ground terminal GNDdig. The cable connecting circuit 220 further includes a DC blocking capacitor 225.

Figure 3:
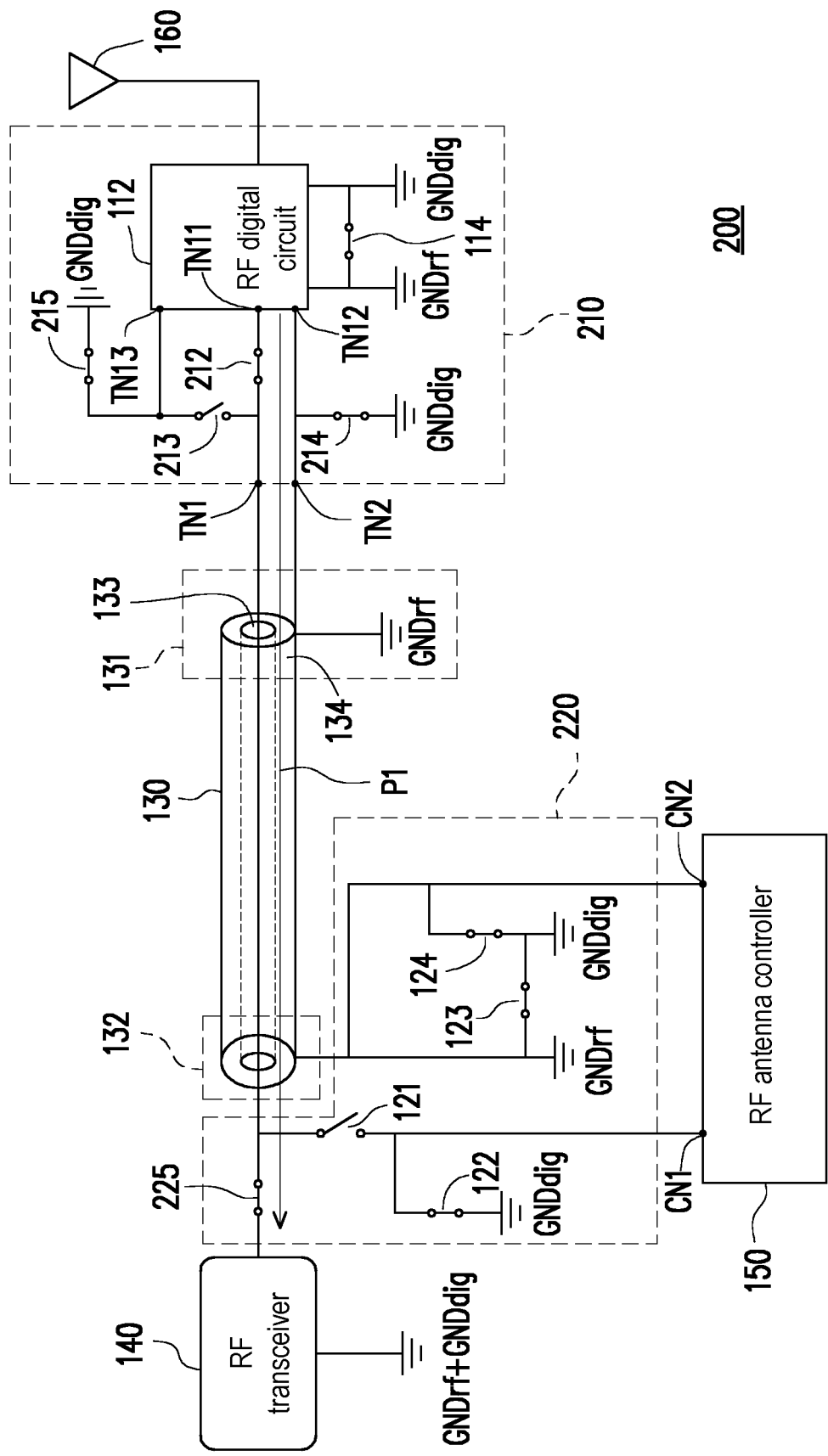
FIG. 3 is a schematic diagram of a connection relationship of various components of the signal transmission device of FIG. 2 in a high frequency signal domain.

FIG. 3 is a schematic diagram of a connection relationship of various components of the signal transmission device 200 of FIG. 2 in the high frequency signal domain. Referring to FIG. 3, in the high frequency signal domain (i.e., in the case of high frequency signal transmission), two ends of the first bypass capacitor 122, the first coupling capacitor 123, the second bypass capacitor 124, the second coupling capacitor 114, the DC blocking capacitor 212, the third bypass capacitor 214, the fourth bypass capacitor 215, and the DC blocking capacitor 225 in FIG. 3 may produce the virtual short circuit effect, so that voltage levels of the RF ground terminal GNDrf and the digital ground terminal GNDdig are the same, and the second conductor 134 of the RF cable 130 is connected to the digital ground terminal GNDdig through the third bypass capacitor 214. In addition, the DC blocking capacitor 212 and the DC blocking capacitor 225 do not block the RF signal received or to be transmitted by the antenna 160, so that the RF signal may be transmitted from the RF digital circuit 112 to the RF transceiver 140 or received from the RF transceiver 140 through the RF cable 130.

In the high frequency signal domain (i.e., in the case of high frequency signal transmission), two ends of the first choke inductor 121 and the second choke inductor 213 in FIG. 3 may produce the virtual open circuit effect, so that the first conductor 133 of the RF cable 130 in FIG. 2 is not coupled to the first control signal receiving end TN13 of the RF digital circuit 112. Namely, in the high frequency signal domain, viewing from the first transceiver end TN1 of the RF transceiver 140 toward the second choke inductor 123, the circuit has the high impedance state. Therefore, the RF signal obtained or to be transmitted by the active antenna 160 is transmitted through the RF output end TN11 of the RF digital circuit 112 to pass through the DC blocking capacitor 212, the first conductor 133 of the RF cable 130, and the DC blocking capacitor 225 via a path P1 for the transceiver end TN3 of the RF transceiver 140 to receive or transmit.

Figure 4:
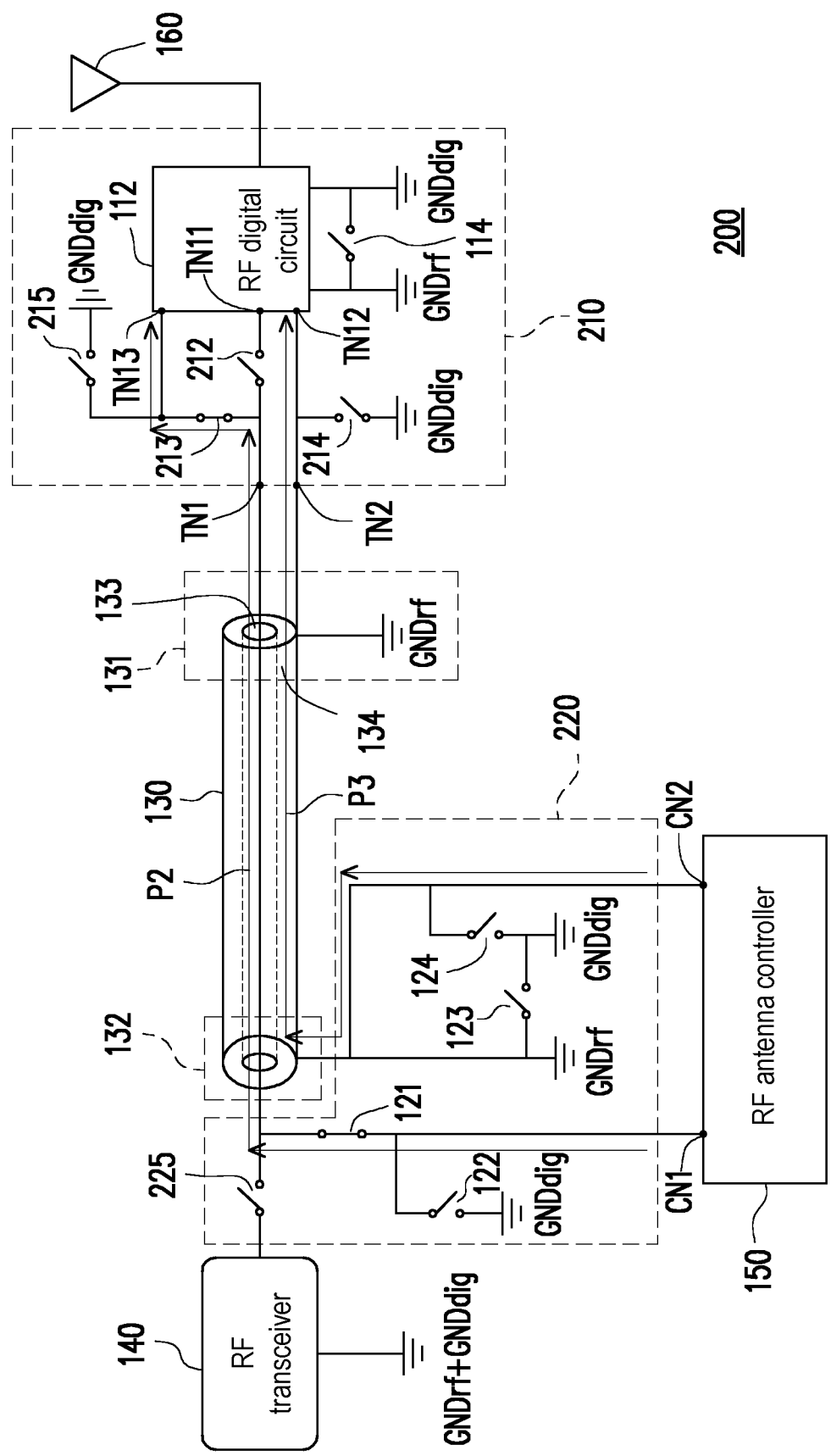
FIG. 4 is a schematic diagram of a connection relationship of various components of the signal transmission device of FIG. 2 in a low frequency signal domain.

FIG. 4 is a schematic diagram of a connection relationship of various components of the signal transmission device 200 of FIG. 2 in the low frequency signal domain. In the low frequency signal domain (i.e., in the case of low frequency signal transmission), two ends of the first bypass capacitor 122, the first coupling capacitor 123, the second bypass capacitor 124, the second coupling capacitor 114, the DC blocking capacitor 212, the third bypass capacitor 214, the fourth bypass capacitor 215, and the DC blocking capacitor 225 in FIG. 4 may produce the virtual open circuit effect. In the low frequency signal domain (i.e., in the case of low frequency signal transmission), the two ends of the first choke inductor 121 and the second choke inductor 213 in FIG. 4 may have the virtual short circuit effect. Therefore, a part of the control signals transmitted by the first conductor 133 of the RF cable 130 in FIG. 4 is transmitted from the first control end CN1 of the RF antenna controller 150 to pass through the first choke inductor 121, the first conductor 133 of the RF cable 130, the second choke inductor 213 via a path P2 and is input to the first control signal receiving end TN13 of the RF digital circuit 112. Conversely, the sensing signal of the first control signal receiving end TN13 of the RF digital circuit 112 may also be transmitted to the first control end CN1 of the RF antenna controller 150 through the path P2. Another part of the control signals transmitted by the second conductor 134 of the RF cable 130 in FIG. 4 is transmitted from the second control end CN2 of the RF antenna controller 150 to pass through the second conductor 134 of the RF cable 130 via a path P3, and is inputted to the second control signal receiving end TN12 of the RF digital circuit 112. Conversely, the sensing signal of the second control signal receiving end TN12 of the RF digital circuit 112 may also be transmitted to the second control terminal CN2 of the RF antenna controller 150 through the path P3.

The RF transceiver 140 of the embodiment may be implemented by a wireless wide area network (WWAN) transceiver module, and those applying the embodiments may use RF transceivers 140 of different applications for implementation according to their needs. Capacitance values of the coupling capacitors (for example, the first coupling capacitor 123 and the second coupling capacitor 114) described in the embodiment require relatively large values for easy implementation. In the embodiment, the first coupling capacitor 123 and the second coupling capacitor 114 between the digital ground terminal GNDdig and the RF ground terminal GNDrf may be implemented by metal-insulator-metal (MIM) capacitor elements.

In summary, in the signal transmission device and the cable connecting circuit described in the embodiments of the invention, through two conductors in the RF cable that are not contacted with each other (i.e., an inter wire and an outer mesh conductor in the RF cable), and due to that the capacitors generate the virtual short circuit effect, and the inductor generates the virtual open circuit in the high frequency signal domain, high frequency signals of the RF transceiver in the electronic device may be received and transmitted through the antenna, and the RF antenna controller and the active antenna module may exchange control signals through the RF cable. In this way, by adjusting the cable connecting circuit and/or the RF processing circuit at both ends of the RF cable without adjusting the structure of the RF cable, the control signal of the active antenna module or the sensing signal obtained by the active antenna may be transmitted through the RF cable, and there is no need to add additional connecting wires, connectors, and terminals on the printed circuit board for transmitting the control signal or the sensing signal, thereby saving the related cost of wires for transmitting the control signal and the sensing signal and avoiding occupying a part of space of the printed circuit board in the electronic device for serving as a signal transmission terminal.

What is claimed is:

1. A signal transmission device, comprising:
a radio frequency processing circuit, coupled to a first connecting end of a radio frequency cable, wherein the radio frequency processing circuit has a first transceiver end and a second transceiver end, wherein the first transceiver end is coupled to a first conductor in the radio frequency cable and the second transceiver end is coupled to a second conductor in the radio frequency cable; and
a cable connecting circuit, coupled to a second connecting end of the radio frequency cable, a radio frequency transceiver, and a radio frequency antenna controller,
wherein the cable connecting circuit comprises:
a first choke inductor, having one end coupled to a transceiver end of the radio frequency transceiver, another end coupled to a first control end of the radio frequency antenna controller, and the transceiver end being coupled to the first conductor;
a first bypass capacitor, coupled between the another end of the first choke inductor and a digital ground terminal;
a first coupling capacitor, coupled between the digital ground terminal and a radio frequency ground terminal, wherein the second conductor is coupled to the radio frequency ground terminal and a second control end of the radio frequency antenna controller at the second connecting end of the radio frequency cable; and a second bypass capacitor, coupled between the second control end of the radio frequency antenna controller and the digital ground terminal.

2. The signal transmission device as claimed in claim 1, wherein the radio frequency processing circuit is further coupled to an antenna, the radio frequency processing circuit uses the first transceiver end and the second transceiver end to obtain a control signal from the first control end and the second control end of the radio frequency antenna controller through the radio frequency cable, and controls the antenna according to the control signal, and a radio frequency signal obtained by the antenna is transmitted to the transceiver end of the radio frequency transceiver through the first transceiver end of the radio frequency processing circuit and the radio frequency cable.

3. The signal transmission device as claimed in claim 2, wherein the control signal is a direct current signal, and the radio frequency signal is an alternating current signal.

4. The signal transmission device as claimed in claim 2, wherein the antenna and the radio frequency processing circuit are collectively referred to as a tunable antenna or a hybrid antenna.

5. The signal transmission device as claimed in claim 1, wherein the radio frequency processing circuit comprises a second coupling capacitor, and the second coupling capacitor is coupled between the radio frequency ground terminal and the digital ground terminal.

6. The signal transmission device as claimed in claim 5, wherein the radio frequency processing circuit further comprises:

a direct current blocking capacitor, coupled between the first transceiver end and a radio frequency output end of the radio frequency processing circuit, wherein the radio frequency output end is configured to transmit a radio frequency signal obtained by the antenna;

a second choke inductor, coupled between the first transceiver end of the radio frequency processing circuit and a first control signal receiving end of the radio frequency processing circuit;

a third bypass capacitor, coupled between the second transceiver end and the digital ground terminal; and a fourth bypass capacitor, coupled between the first control signal receiving end of the radio frequency processing circuit and the digital ground terminal.

7. The signal transmission device as claimed in claim 6, wherein the second transceiver end of the radio frequency processing circuit serves as a second control signal receiving end of the radio frequency processing circuit, and the radio frequency processing circuit obtains a control signal through the first control signal receiving end and the second control signal receiving end.

8. The signal transmission device as claimed in claim 5, wherein the first coupling capacitor and the second coupling capacitor are both a metal-insulator-metal capacitor element.

9. The signal transmission device as claimed in claim 1, wherein the second transceiver end of the radio frequency processing circuit serves as a second control signal receiving end of the radio frequency processing circuit, and the radio frequency processing circuit obtains a control signal through the first control signal receiving end and the second control signal receiving end.

10. The signal transmission device as claimed in claim 1, wherein the radio frequency cable is a coaxial cable.

11. A cable connecting circuit, adapted to an electronic device comprising a connecting end of a radio frequency cable, a radio frequency transceiver, and a radio frequency antenna controller, the cable connecting circuit comprising:

a first choke inductor, having one end coupled to a transceiver end of the radio frequency transceiver, another end coupled to a first control end of the radio frequency antenna controller, and the transceiver end being coupled to a first conductor of the radio frequency cable;

a first bypass capacitor, coupled between the another end of the first choke inductor and a digital ground terminal;

a first coupling capacitor, coupled between the digital ground terminal and a radio frequency ground terminal, wherein a second conductor of the radio frequency cable is coupled to the radio frequency ground terminal and a second control end of the radio frequency antenna controller at the connecting end of the radio frequency cable; and a second bypass capacitor, coupled between the second control end of the radio frequency antenna controller and the digital ground terminal.

* * * * *